(12) United States Patent
Hu

(10) Patent No.: US 8,942,028 B1
(45) Date of Patent: Jan. 27, 2015

(54) DATA REPROGRAMMING FOR A DATA STORAGE DEVICE

(71) Applicant: Sandisk Technologies Inc., Plano, TX (US)

(72) Inventor: Xinde Hu, San Diego, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/305,386

(22) Filed: Jun. 16, 2014

(51) Int. Cl.
  *G11C 11/00* (2006.01)
  *G11C 11/34* (2006.01)
  *G11C 29/00* (2006.01)
  *G11C 13/00* (2006.01)
  *G11C 29/52* (2006.01)

(52) U.S. Cl.
  CPC ............ *G11C 13/0069* (2013.01); *G11C 29/52* (2013.01)
  USPC .................. 365/148; 365/185.03; 365/185.08; 365/185.09; 365/185.24; 365/185.33; 365/200

(58) Field of Classification Search
  USPC .................. 365/148, 185.03, 185.08, 185.09, 365/185.24, 185.33, 200
  See application file for complete search history.

(56) References Cited

U.S. PATENT DOCUMENTS

| 8,117,508 | B2 | 2/2012 | Tokiwa |
| 8,607,124 | B2 * | 12/2013 | Weingarten .............. 365/185.09 |
| 8,619,459 | B1 | 12/2013 | Nguyen et al. |
| 8,681,550 | B2 * | 3/2014 | Wu et al. .................. 365/185.09 |
| 2014/0119108 | A1 | 5/2014 | Lee |
| 2014/0119115 | A1 | 5/2014 | Jung et al. |
| 2014/0136925 | A1 | 5/2014 | Joo |

FOREIGN PATENT DOCUMENTS

WO    2013177566 A1    11/2013

* cited by examiner

*Primary Examiner* — Trong Phan
(74) *Attorney, Agent, or Firm* — Toler Law Group, PC

(57) ABSTRACT

A data storage device includes a non-volatile memory and a controller. A method includes programming information to the non-volatile memory. The information includes multiple codewords. The method further includes accessing a sample codeword of the multiple codewords from the non-volatile memory and determining an error rate associated with the sample codeword. The error rate is determined by an error correcting code (ECC) engine. The method further includes programming the information at the non-volatile memory in response to the error rate satisfying an error threshold.

20 Claims, 6 Drawing Sheets

DATA REPROGRAMMING FOR A DATA STORAGE DEVICE

FIELD OF THE DISCLOSURE

The present disclosure is generally related to data storage devices and more particularly to data reprogramming for data storage devices.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. Consequently, memory devices enable users to store and access a large amount of data.

As a number of bits stored per cell increases, errors in stored data typically increase (e.g., due to noise and other factors). A data storage device may encode and decode data using an error correcting code (ECC) technique. The ECC technique may enable error correction. For example, data may be stored with ECC information (e.g., parity bits) to enable correction of errors that may be present in the data. In some cases, data stored at the data storage device may include a large number of errors (e.g., due to noise or other factors). To illustrate, one or more write errors may occur during a write operation. A write error may be caused by applying too many or too few programming signals to a storage element of the data storage device (i.e., by over-programming or under-programming the storage element). In this case, an error rate of data may exceed an error correction capability associated with the particular ECC scheme used by the data storage device, which may result in data loss.

SUMMARY

Operation of a data storage device may be enhanced by selectively re-programming information written to the data storage device when a sample of the information contains a large number of errors. To illustrate, after writing information, an error rate of a "sample" of the information may be determined. The sample may correspond to a sample codeword of multiple codewords that are included in the information. If the error rate of the sample satisfies a threshold, the information may be re-programmed at the data storage device. If the error rate of the sample fails to satisfy the threshold, the data storage device may determine that the information is not to be re-programmed (e.g., does not contain a large number of errors). By determining an error rate associated with a sample of information, the data storage device may increase reliability of the programming operations, such as by re-programming the information to correct one or more write errors that may occur during the programming operations. In a particular embodiment, the data storage device includes a resistive random access memory (ReRAM).

DETAILED DESCRIPTION

Figure 1:
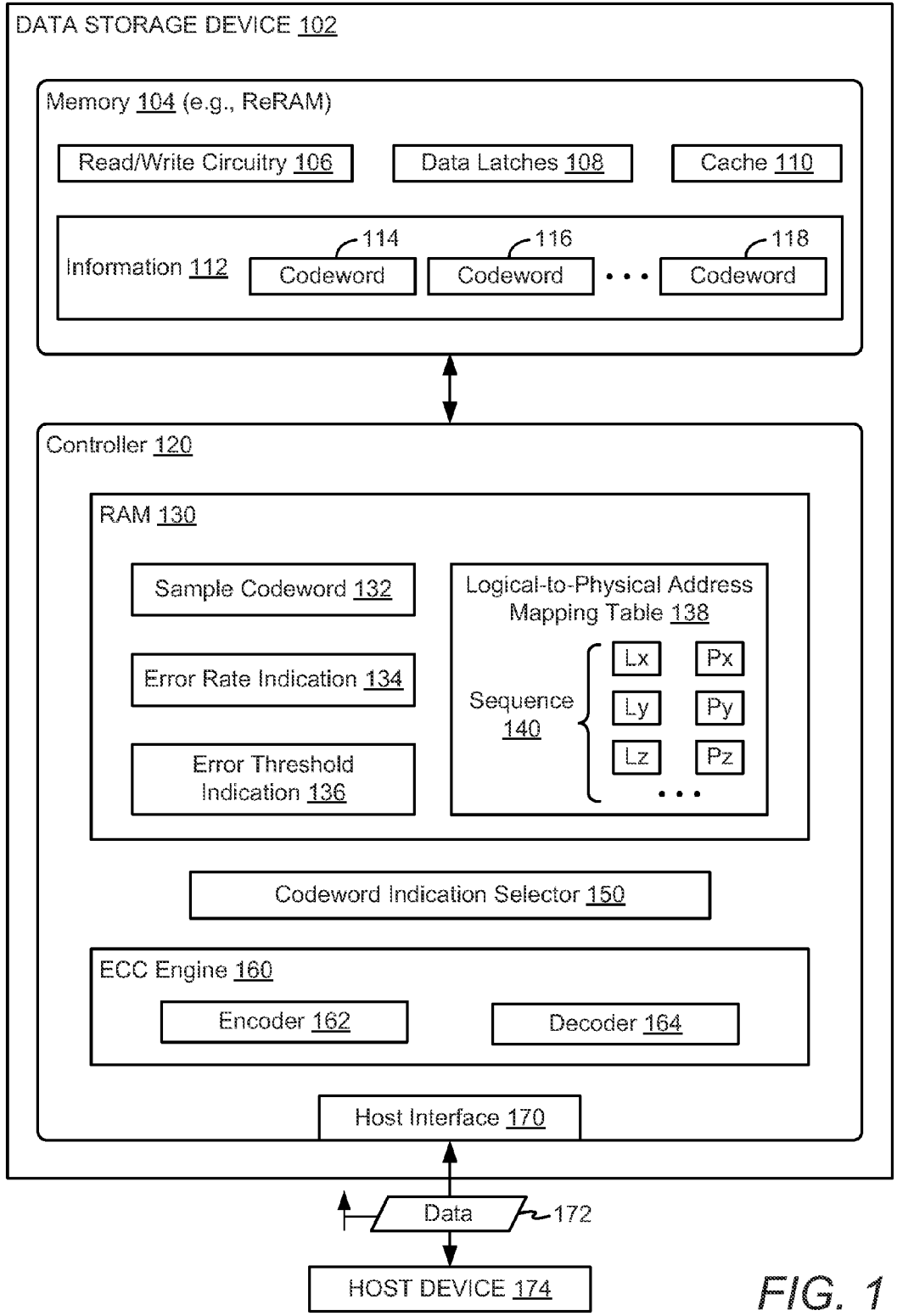
FIG. 1 is a block diagram of a particular illustrative embodiment of a system that includes a data storage device including a memory and a controller that is configured to re-program data at the memory.

Referring to FIG. 1, a particular illustrative embodiment of a system is depicted and generally designated 100. The system 100 includes a data storage device 102 and a host device 174. The data storage device 102 and the host device 174 may be operationally coupled via a connection, such as a bus or a wireless connection. The data storage device 102 may be embedded within the host device 174, such as in accordance with a Joint Electron Devices Engineering Council (JEDEC) Solid State Technology Association Universal Flash Storage (UFS) configuration. Alternatively, the data storage device 102 may be removable from the host device 174 (i.e., "removably" coupled to the host device 174). As an example, the data storage device 102 may be removably coupled to the host device 174 in accordance with a removable universal serial bus (USB) configuration.

The data storage device 102 may include a memory 104 and a controller 120 that is operationally coupled to the memory 104. The memory 104 may include a non-volatile memory, such as a resistive random access memory (ReRAM). The memory 104 may include read/write circuitry 106, data latches 108, and a cache 110.

The memory 104 may have a three-dimensional (3D) memory configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration.

The controller 120 may include a random access memory (RAM) 130, a codeword indication selector 150, and an error correcting code (ECC) engine 160. The ECC engine 160 may include an encoder 162 and a decoder 164.

The encoder 162 is configured to receive data and to generate one or more ECC codewords based on the data. The encoder 162 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The decoder 164 is configured to decode data accessed from the memory 104. For example, the decoder 164 may be configured to decode data accessed from the memory 104 to detect and correct one or more errors that may be present in the data, up to an error correcting capacity of the particular ECC scheme. The decoder 164 may include a Hamming decoder, an RS decoder, a BCH decoder, an LDPC decoder, a turbo decoder, a decoder configured to decode data according to one or more other ECC schemes, or a combination thereof.

The controller 120 is configured to receive data and instructions from the host device 174 and to send data to the host device 174. For example, the controller 120 may send data to the host device 174 via the host interface 170 and may receive data from the host device 174 via the host interface 170.

The controller 120 is configured to send data and commands to the memory 104 and to receive data from the memory 104. For example, the controller 120 is configured to send data and a write command to cause the memory 104 to store the data to a specified address of the memory 104. The write command may specify a physical address of a portion of the memory 104 (e.g., a physical address of the memory 104) that is to store the data. The controller 120 is configured to send a read command to the memory 104 to access data from a specified address of the memory 104. The read command may specify the physical address of a portion of the memory 104 (e.g., a physical address of the memory 104).

The host device 174 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 174 may communicate via a host controller, which may enable the host device 174 to communicate with the data storage device 102. The host device 174 may operate in compliance with a JEDEC Solid State Technology Association industry specification, such as an embedded MultiMedia Card (eMMC) specification or a Universal Flash Storage (UFS) Host Controller Interface specification. The host device 174 may operate in compliance with one or more other specifications, such as a Secure Digital (SD) Host Controller specification as an illustrative example. Alternatively, the host device 174 may communicate with the data storage device 102 in accordance with another communication protocol.

In operation, the controller 120 may receive data 172 and a request for write access to the memory 104 from the host device 174 via the host interface 170. The data 172 may correspond to a block of data, such as a data file (e.g., an image file, an audio file, or a video file, as illustrative examples). The controller 120 may input the data 172 to the encoder 162 to generate one or more ECC codewords based on the data 172.

The controller 120 may store the one or more ECC codewords to the memory 104. For example, the controller 120 may send information 112 to the memory 104, and the information 112 may correspond to a set of ECC codewords generated by the encoder 162 based on the data 172. The information 112 may be stored to a storage region of the memory 104, such as one or more word lines of storage elements of the memory 104. FIG. 1 illustrates that the information 112 may include codewords 114, 116, and 118. The codewords 114, 116, and 118 may correspond to a single block (or "chunk") of data. It should be appreciated that a block of data may include more than three codewords or fewer than three codewords (e.g., two, four, etc.).

Depending on the particular implementation, the memory 104 may store the codewords 114, 116, and 118 at the cache 110 prior to moving the codewords 114, 116, and 118 to another storage region of the memory 104. To illustrate, the cache 110 may correspond to "short-term" storage, such as a single-level cell (SLC) cache or a dynamic random access memory (DRAM) cache. In this example, the memory 104 may move the codewords 114, 116, and 118 from the cache 110 to another storage region of the memory 104, such as a multi-level cell (MLC) storage region. In other implementations, the memory 104 may not include a cache.

In a particular embodiment, the codewords 114, 116, and 118 are programmed to the memory 104 sequentially. For example, the controller 120 may program the codeword 114 before programming the codewords 116, 118. The controller 120 may program the codeword 116 after programming the codeword 114 may program the codeword 118 after programming the codewords 116, 118. Alternatively, the controller 120 may program the information 112 using another technique, such as using a different sequence of the codewords 114, 116, and 118.

One or more write errors may occur while programming the information 112 to the memory 104. To illustrate, a write error may occur if a storage element of the memory 104 is over-programmed (e.g., if a programming signal is applied for longer than a target duration or if a programming voltage exceeds a target voltage) or if the storage element is under-programmed (e.g., if the programming signal is applied for shorter than the target duration or if a programming voltage is less than a target voltage). In this case, sensing the storage element may indicate the "wrong" value (e.g., a logic "0" value instead of a logic "1" value, or vice versa). A large number of errors of the information 112 may exceed an error correction capability of the decoder 164 during decoding of the information 112. As an illustrative example, if the data storage device 102 is subject to noise or electromagnetic interference during programming of the information 112, a large number of write errors may occur in the information 112, and data loss may occur. Further, even if the number of errors is initially within the error correction capability of the decoder 164 after writing, a large number of read operations and/or long data retention may introduce additional errors (e.g., due to read disturb errors, etc.).

The controller 120 may be configured to re-program the information 112 in certain circumstances, such as if the information 112 includes a high number of write errors. To illustrate, the controller 120 may be configured to determine (or estimate) a number of errors associated with a representative portion (or "sample") of the information 112. In a particular embodiment, the codewords 114, 116, and 118 are programmed to the memory 104 in a sequence 140, and the codeword indication selector 150 is configured to select the codeword that is programmed to the memory 104 first in the sequence.

To further illustrate, the codeword indication selector 150 may be configured to select an indication from a set of indications associated with the codewords 114, 116, and 118. For example, the codeword indicator selector 150 may be configured to access a logical-to-physical address mapping table 138 stored at the RAM 130 to identify the sequence 140. In the example of FIG. 1, the logical-to-physical address mapping table 138 maps a set of logical addresses (e.g., Lx, Ly, and Lz) to a set of physical addresses (e.g., Px, Py, and Pz) of the memory 104. For example, the physical address Px may correspond to storage elements that store the codeword 114, the physical address Py may correspond to storage elements that store the codeword 116, and the physical address Pz may correspond to storage elements that store the codeword 118. Depending on the particular implementation, the controller 120 may be configured to write sequentially to physical addresses of the memory 104, such as in accordance with the sequence 140 (e.g., first Px, then Py, then Pz, etc.). In this case, the codeword indication selector 150 may be configured to select a first item in the sequence 140, such as a numerically lowest physical address of a group of physical addresses targeted by a particular write operation (i.e., Px in this example). Thus, the codeword indication selector 150 may select a codeword stored at the physical address Px as "representative" of the information 112.

Selecting the codeword that is written to the memory 104 first in the sequence 140 may enable selection of the "worst" codeword of a group of codewords written in a particular write operation. For example, codewords written earlier in the sequence 140 may be subject to more write disturb effects and other noise conditions than codewords written later in the sequence 140. Thus, the codeword written to the memory 104 first in the sequence 140 may contain more errors than codewords written later in the sequence 140.

In another example, the codeword indication selector 150 may be configured to select a codeword written to the memory 104 last in the sequence 140 (such as a "last in" codeword), which may correspond to the codeword 118 in the example of FIG. 1. By selecting the "last in" codeword of the codewords 114, 116, and 118, the controller 120 may avoid adjusting one or more command signals provided to the memory 104 after writing the codewords 114, 116, and 118 to the memory 104. For example, the controller 120 may maintain a physical address selection signal asserted on a bus that operationally couples the controller 120 and the memory 104. In other cases, the controller 120 may select an intermediate (e.g., middle) codeword of the codewords 114, 116, and 118, which may correspond to the codeword 116 in the example of FIG. 1. In other cases, the codeword indication selector 150 may be configured to select a sample codeword using one or more other techniques.

To further illustrate, in some implementations, codewords may be written to the memory 104 non-sequentially. In this case, the codeword indication selector 150 may be configured to randomly or pseudo-randomly select an indication of a codeword (e.g., a physical address) associated with one or more of the codewords 114, 116, and 118, as an illustrative example. In another embodiment, the codeword indication selector 150 may maintain a table indicating an order of physical addresses targeted during writing of the information 112. For example, the codeword indication selector 150 may be configured to monitor a bus that operationally couples the memory 104 and the controller 120 to detect physical addresses targeted during writing of the information 112.

If the codeword indication selector 150 selects an indication (e.g., the physical address Px) corresponding to the codeword 114, the controller 120 may send a read command to the memory 104 to sense the codeword 114 to generate a representation of the codeword 114, such as a sample codeword 132. The controller 120 may input the sample codeword 132 to the ECC engine 160. The sample codeword 132 may correspond to an invalid ECC codeword that differs from a valid ECC codeword due to one or more errors (e.g., due to one or more write errors) or to a valid ECC codeword (e.g., that can be directly mapped to user data by the ECC engine 160).

The ECC engine 160 may determine (or estimate) an error rate associated with the sample codeword 132. An example of an error rate is a bit error rate (BER). For example, the ECC engine 160 may input the sample codeword 132 to the decoder 164 to initiate a decoding process (e.g., to generate the data 172, or a portion of the data 172). During the decoding process, the ECC engine 160 may determine (e.g., count) a number of errors that are corrected by the decoder 164. In this example, the number of errors may be identified by an error rate indication 134. The error rate indication 134 may indicate a BER associated with the sample codeword 132.

In another example, the ECC engine 160 may be configured to estimate a number of errors of the sample codeword 132 without decoding the sample codeword 132. The ECC engine 160 may estimate the number of errors based on an ECC scheme associated with the sample codeword 132. To illustrate, depending on the particular ECC scheme, a valid codeword may include a number of logic "0" values (or logic "1" values) that is within a particular range, such as between 40 percent and 60 percent logic "0" values (or logic "1" values), as a non-limiting, illustrative example. As another example, an ECC scheme may specify that a valid codeword is to include at least a threshold percentage of bit transitions, such as at least one bit transition for every five bits, as an illustrative, non-limiting example. In this case, the error rate indication 134 may identify the estimated number of errors of the sample codeword 132.

The controller 120 may be configured to compare the error rate identified by the error rate indication 134 with an error threshold identified by an error threshold indication 136. If the error rate satisfies the error threshold (e.g., is greater than or equal to the threshold), then the controller 120 may re-program the information 112.

The error threshold can be selected based on one or more criteria. In a particular embodiment, the error threshold may be low enough to enable high data reliability (e.g., to ensure that errors are corrected after programming operations) and also high enough to avoid a large number of program/erase (P/E) cycles (which can reduce performance of or even damage the memory 104).

In an illustrative embodiment, the controller 120 is configured to re-encode the data 172 in response to the error rate satisfying the error threshold. The controller 120 may re-program (e.g., overwrite) the information 112 with the re-encoded information. Depending on the implementation, the controller 120 may erase a storage region storing the information 112 prior to re-programming the information 112 with the re-encoded information. In other implementations, the memory 104 may support an in-place overwrite of the information 112.

Alternatively or in addition, the controller 120 may be configured to access a representation of the information 112 stored at the data storage device 102, such as at the cache 110. For example, in some implementations, the cache 110 may correspond to a SLC cache and/or a DRAM cache that stores data associated with a write operation until displaced (e.g., overwritten or "evicted") by data associated with a subsequent write operation. In this case, the cache 110 may store a representation of the information 112 (even after the information 112 has been programmed to the memory 104). The controller 120 may cause the read/write circuitry 106 to re-program the information 112 using the representation. In a particular embodiment, the controller 120 is configured to access the representation from the cache 110, to decode and re-encode the representation using the ECC engine 160 to generate re-encoded data, and to re-program the information 112 using the re-encoded data.

In some cases, an error rate of one or more of the codewords 114, 116, and 118 may exceed an error correction capability of the ECC engine 160 (e.g., due to a large number of write errors). In this case, the controller 120 may request a copy of the data 172 from the host device 174. The controller 120 may receive the copy of the data 172 from the host device 174, may encode the copy of the data 172 using the ECC engine 160, and may re-program the information 112 using the encoded copy of the data 172.

Depending on the particular implementation, information may be re-programmed to a storage region at a common (or same) physical location of the memory 104. For example, if one or more physical addresses (e.g., physical addresses Px, Py, and Pz) store the information 112, then re-programming the information 112 may include programming information to the physical addresses Px, Py, and Pz. In other implementations, the one or more physical addresses can be erased and the information 112 can be "moved" to another location of the memory 104 (i.e., to a different set of physical addresses of the memory 104).

Although the example of FIG. 1 is described with reference to a single sample codeword (the sample codeword 132), it should be appreciated that codeword indication selector 150 may be configured to select multiple sample codewords (e.g., two sample codewords, three sample codewords, etc.). To illustrate, the codeword indication selector 150 may be configured to select a number of sample codewords based on a data size of the information 112. As a non-limiting example, the codeword indication selector 150 may be configured to select one sample codeword for each N megabytes (MB) of the information 112, where N is a positive integer number (e.g., one, two, four, eight, etc.).

The example of FIG. 1 illustrates that one or more errors associated with a programming operation can be detected and corrected. For example, the controller 120 may detect a large number of errors associated with the information 112, which may be indicated by the error rate indication 134. By re-programming the information 112 in response to a large number of errors associated with the information 112, data loss can be avoided at the data storage device 102.

The techniques of FIG. 1 may be particularly advantageous in connection with memories that experience more errors resulting from program/erase (P/E) cycles than errors associated with the physical structure of storage elements (e.g., due to small physical size of storage elements). To illustrate, in some applications, a ReRAM may experience more errors resulting from P/E cycles, and a NAND flash device may experience more errors due to physical structure of storage elements. Because data at a ReRAM may be sensitive to P/E cycles, re-programming data at a ReRAM may ensure quality of data (as compared to certain NAND flash implementations, where re-programming of data to the same storage elements may still result in errors). However, it is noted that the techniques described herein are applicable to a wide variety of memory devices.

Figure 2:
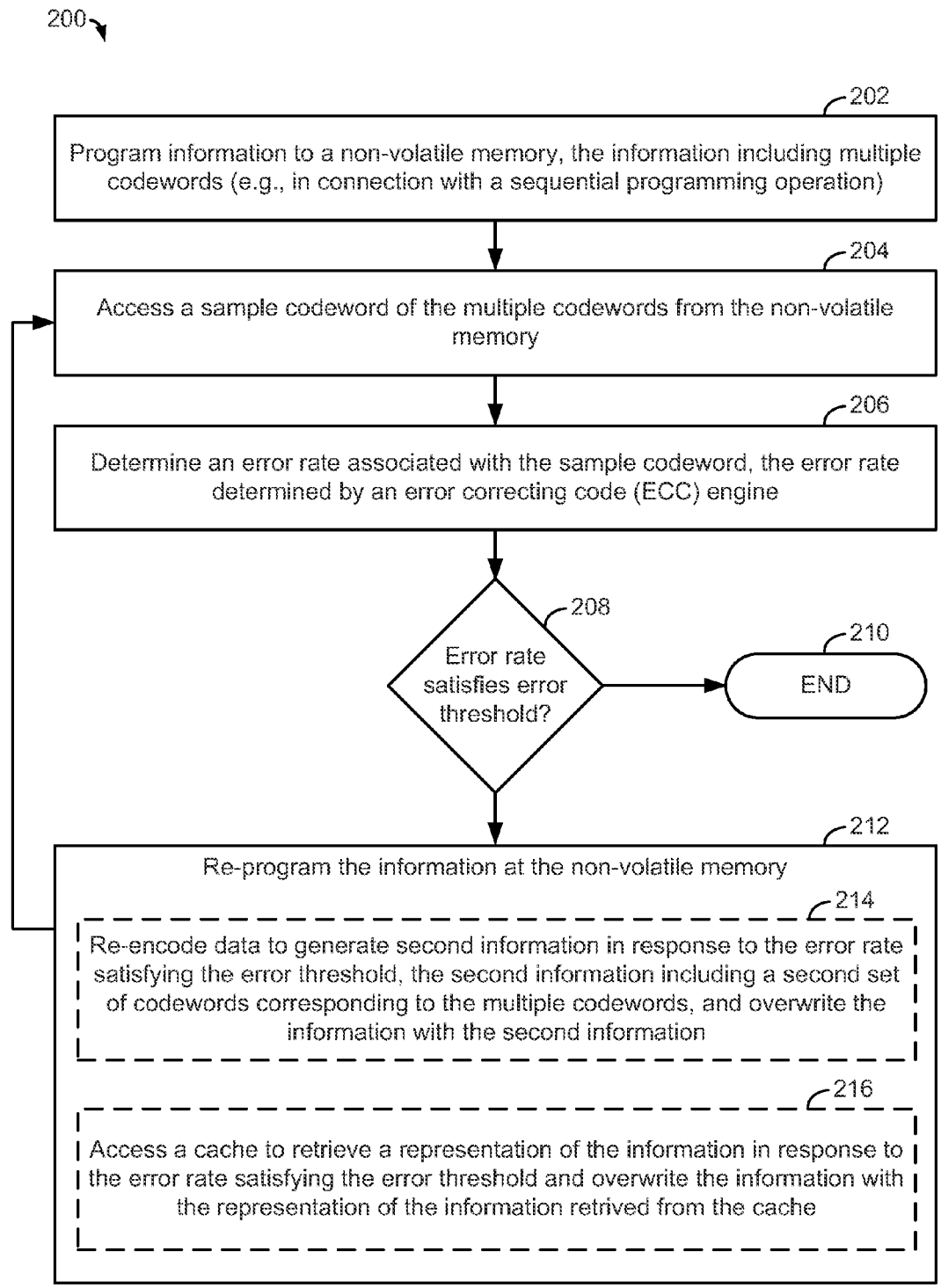
FIG. 2 is a flow diagram of an illustrative method of operation of the data storage device of FIG. 1.

Referring to FIG. 2, a particular illustrative embodiment of a method is depicted and generally designated 200. The method 200 may be performed at a data storage device that includes a non-volatile memory. The data storage device may correspond to the data storage device 102, and the non-volatile memory may correspond to the memory 104. The method 200 may be performed by the controller 120.

The method 200 may include programming information to the non-volatile memory, at 202. The information may include multiple codewords, and the information may be programmed in connection with a sequential programming operation at the memory 104. The information may correspond to the information 112, and the multiple codewords may include the codewords 114, 116, and 118.

The method 200 may further include accessing a sample codeword of the multiple codewords from the non-volatile memory, at 204. The sample codeword may correspond to the sample codeword 132.

The method 200 may further include determining an error rate associated with the sample codeword, at 206. The error rate is determined by an ECC engine. The ECC engine may correspond to the ECC engine 160, and the error rate may be indicated by the error rate indication 134.

The method 200 may further include determining whether the error rate satisfies an error rate threshold, at 208. The error rate may be indicated by the error rate indication 134. If the error rate does not satisfy the error threshold, the method 200 may end, at 210.

If the error rate satisfies the error threshold, the method 200 may further include re-programming the information at the non-volatile memory, at 212. For example, re-programming the information 112 may optionally include re-encoding the data 172 to generate second information that includes a second set of codewords corresponding to the multiple codewords, at 214. The information 112 may be overwritten with the second information (e.g., by replacing the multiple codewords with the second set of codewords).

As another example, re-programming the information 112 may include accessing the cache 110 to retrieve a representation of the information 112 from the cache 110, and the information 112 may be overwritten with the representation retrieved from the cache 110, at 216. To illustrate, the sequential write operation may include writing the information 112 to the cache 110 prior to "copying" or moving the information 112 to a storage region of the memory 104. In this case, the cache 110 may store a representation of the information 112, and the information 112 may be overwritten using the representation retrieved from the cache 110.

After re-programming the information, the method 200 may further include accessing a second sample of the re-programmed information (at 204), determining a second error rate associated with the second sample (at 206), and determining whether the second error rate satisfies the error threshold (at 208). If the second error rate fails to satisfy the error threshold, the method 200 may terminate (at 210). If the error rate satisfies the error threshold, the method 200 may further include re-programming the information (at 212). In a particular embodiment, the data storage device 102 is configured to re-program the information in response to detecting a high BER with each re-programming iteration until a threshold number of reprogramming iterations have been performed before determining that a physical defect exists at the storage region associated with the information. In this case, the controller 120 may relocate the information to another location of the memory 104, and the controller 120 may "close" the storage region to subsequent write operations (e.g., by invalidating one or more physical addresses of the logical-to-physical address mapping table 138, such as the physical addresses Px, Py, and Pz).

The method 200 may enable detection and correction of errors associated with a programming operation. For example, the controller 120 may re-program the information 112 in response to detecting a large number of errors associated with the information 112. By re-programming the information in response to a large number of errors, data loss can be avoided at a data storage device.

Figure 3:
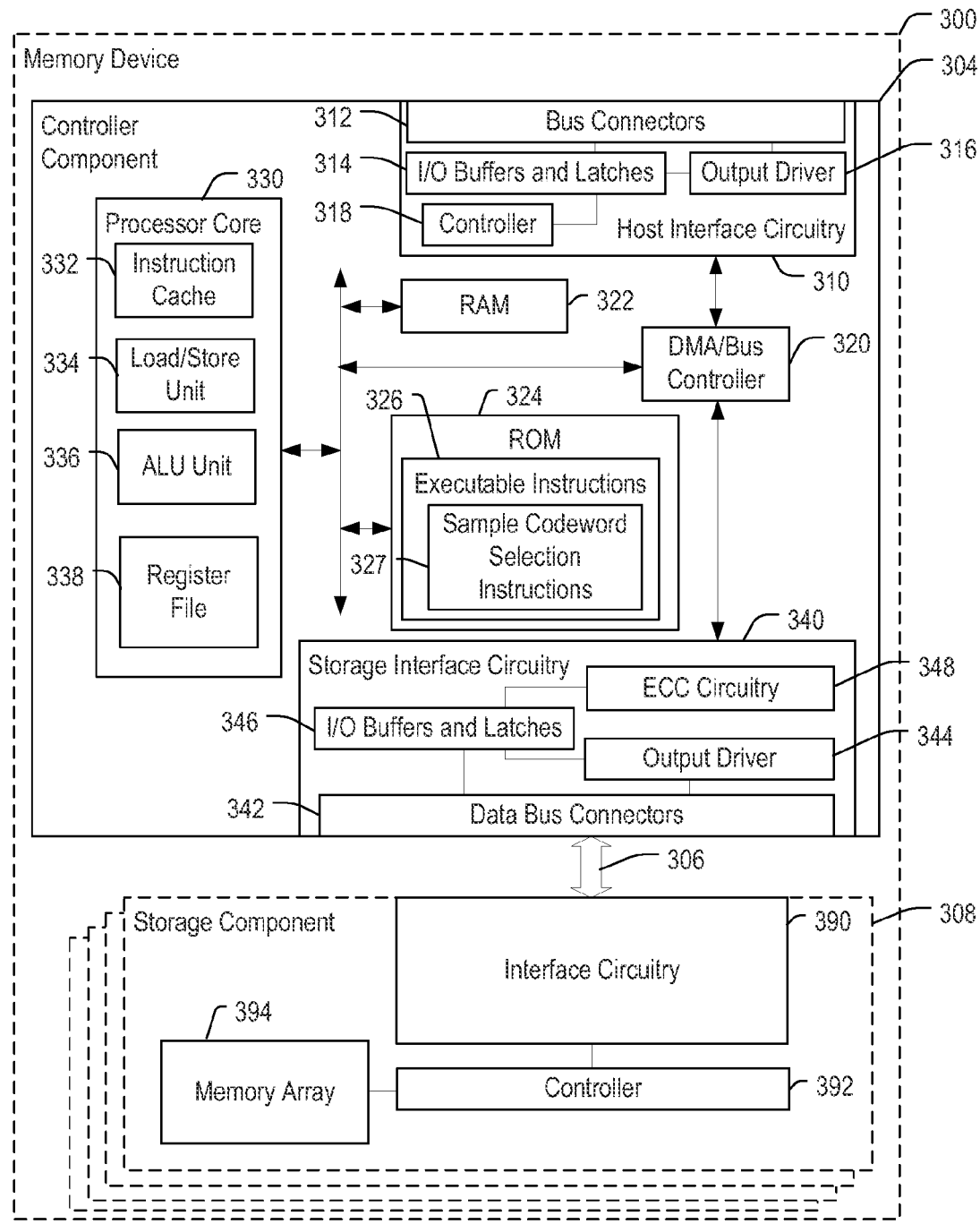
FIG. 3 is a block diagram of a particular embodiment of a memory device that may be included in the data storage device of FIG. 1.

Referring to FIG. 3, an illustrative embodiment of a memory device is depicted and generally designated 300. The memory device 300 includes a controller component 304 coupled to one or more storage components, such as a representative storage component 308, via a bus 306. The representative storage component 308 includes interface circuitry 390 to communicate via the bus 306. The storage component 308 also includes a controller 392 that is coupled to the interface circuitry 390 and that is also coupled to a memory, such as a memory array 394. The memory array 394 may include one or more types of storage media, such as a 3D NAND array or a ReRAM array. The memory array 394 may have a 3D memory configuration. Alternatively, the memory array 394 may have another configuration, such as a 2D memory configuration. In a particular embodiment, the memory device 300 may correspond to the data storage device 102 of FIG. 1.

In a particular embodiment, the controller component 304 includes host interface circuitry 310 coupled to a direct memory access (DMA)/bus controller 320. The controller component 304 also includes storage interface circuitry 340 that is coupled to the DMA/bus controller 320. A processor core 330, a random access memory (RAM) 322 and a read-only memory (ROM) 324 are coupled to the DMA/bus controller 320 via an internal bus.

In a particular embodiment, the host interface circuitry 310 includes bus connectors 312 coupled to input/output (I/O) buffers and latches 314. The bus connectors 312 are further coupled to output driver circuitry 316. The host interface circuitry 310 also includes a controller 318. In a particular embodiment, the host interface circuitry 310 operates in accordance with a universal serial bus (USB) protocol. For example, the controller 318 may be programmed to receive USB protocol instructions and data from a host device (not shown) via the bus connectors 312 that are coupled to a universal serial bus. The controller 318 may include a hardware processor that executes instructions stored at an internal memory, such as a read-only memory (not shown) to enable receipt and acknowledgment of USB instructions and data. Alternatively, or in addition, the host interface circuitry 310 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 330 includes an instruction cache 332, a load/store unit 334, an arithmetic logic unit (ALU) unit 336, and a register file 338. The processor core 330 may include, or may function substantially similarly to, an ARM core, as an illustrative, non-limiting example. For example, the processor core 330 may support a reduced instruction set computer (RISC) micro-architecture. The processor core 330 may be configured to retrieve data and executable instructions 326 via the load/store unit 334 from the ROM 324. The executable instructions 326 may be executable by the processor core 330 to perform one or more operations described herein. For example, the executable instructions 326 may include sample codeword selection instructions 327 executable by the processor core 330 to identify a sample codeword from a block of information, such as in order to generate a "sample" of the block of information to determine if a large number of write errors have occurred while writing the block of information. It should be appreciated that codeword selection operations may be performed using hardware (e.g., logic gates) alternatively or in addition to using executing instructions to perform such operations.

Alternatively, or in addition, at least some of the executable instructions 326 may not be stored at the ROM 324 and may be stored at the memory array 394. The executable instructions 326 may be retrieved from the memory array 394 and stored at the RAM 322. The processor core 330 may be configured to retrieve the executable instructions 326 from the RAM 322 for execution.

The executable instructions 326 may be retrieved by the load/store unit 334 and stored to the instruction cache 332. The ALU unit 336 may include dedicated circuitry to perform arithmetic and logic operations, such as addition and subtraction, AND, NOT, OR, exclusive-OR (XOR), other arithmetic or logic operations, or any combination thereof. For example, the controller component 304 may utilize the ALU unit 336 may to identify a sample codeword from a block of information, such as in order to generate a "sample" of the block of information to determine if a large number of write errors have occurred while writing the block of information.

The register file 338 may include multiple memory cells that may provide high speed access to the processor core 330 of data to be used for execution of instructions. One or more memory cells at the register file 338 may be dedicated to store a status indicator. Additional data values, such as values to indicate memory type, memory write status, and write protect status, may also be set during execution of the executable instructions 326 at the processor core 330.

The storage interface circuitry 340 may include data bus connectors 342, an output driver 344, input/output buffers and latches 346, and ECC circuitry 348. The data bus connectors 342 may include electrical connectors to enable electrical signal propagation via the bus 306. The I/O buffers and latches 346 may be configured to store data that is received via the DMA/bus controller 320 to be transmitted via the bus 306 using electrical signals at the data bus connectors 342 that are generated by the output driver 344. In addition, or alternatively, the I/O buffers and latches 346 may store data values represented by electrical signals received at the data bus connectors 342 via the bus 306, such as signals generated by the interface circuitry 390 of the storage component 308.

The ECC circuitry 348 may correspond to the ECC engine 160 of FIG. 1. The ECC circuitry 348 may include dedicated hardware and circuitry configured to perform operations using data and error correcting code information corresponding to the data that are received as a result of a memory read from the storage component 308, and may perform logical or arithmetic operations to verify that the received data is not detected to have corrupted values. For example, the received data may include additional bits representing an error correcting code, which may be encoded based on values of the data upon storage at the memory array 394. Corruption of one or more bits of the data, or one or more bits of the error correcting code, may be detectable by the ECC circuitry 348. For example, the storage interface circuitry 340 may include a flash memory interface, and the ECC circuitry 348 may be compliant with one or more flash error correcting code protocols.

Figure 4:
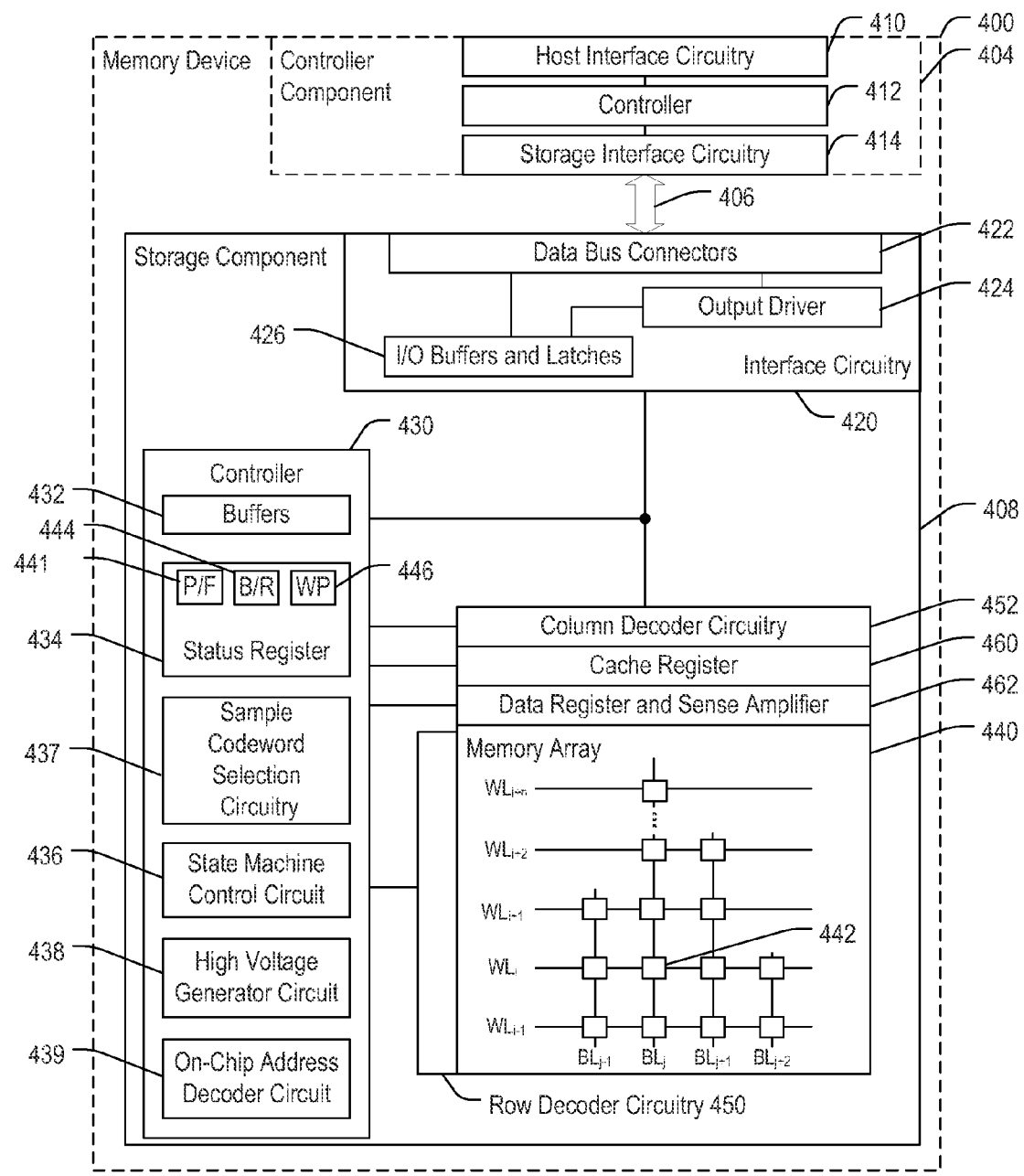
FIG. 4 is a block diagram of another particular embodiment of a memory device that may be included in the data storage device of FIG. 1.

Referring to FIG. 4, an illustrative embodiment of a memory device is depicted and generally designated 400. The memory device 400 includes a controller component 404 coupled to a storage component 408. In a particular embodiment, the memory device 400 may correspond to the data storage device 102 of FIG. 1. For example, the controller component 404 may correspond to the controller 120 of FIG. 1, and the storage component 408 may correspond to the memory 104 of FIG. 1. The storage component 408 may have a 3D memory configuration. Alternatively, the storage component 408 may have another configuration, such as a 2D memory configuration.

The controller component 404 may include host interface circuitry 410, a controller 412, and storage interface circuitry 414. The controller component 404 may be coupled to the storage component 408 via a data bus 406, such as an 8-bit or 16-bit parallel data bus, as an illustrative, non-limiting example. The controller component 404 may communicate instructions and data with an external host (not shown) via the host interface circuitry 410. The controller 412 may be configured to respond to instructions received by the host interface circuitry 410 and may also be configured to send and receive data and instructions to the storage component 408 via the storage interface circuitry 414.

In a particular embodiment, the storage component 408 includes interface circuitry 420, a controller 430 coupled to the interface circuitry 420, and a memory array 440 accessible to the controller 430. The storage component 408 may include one or more sets of row decoder circuitry, such as row decoder circuitry 450. The storage component may further include column decoder circuitry 452. The row decoder circuitry 450 and the column decoder circuitry 452 may enable access to data stored at one or more particular rows and particular columns of the memory array 440, such as to read a value from or to write a value to a particular memory cell 442 at a bit line $BL_j$ and at word line $WL_i$. A cache register 460 and a data register and sense amplifier 462 may further be coupled to the memory array 440 and may be used to cache or to temporarily store data that is to be written to the memory array 440 or data that has been read out of the memory array 440. In a particular embodiment, the memory array 440 may include a flash memory or a ReRAM. The memory array 440 may have a 3D memory configuration.

In a particular embodiment, the controller 430 includes one or more buffers 432 to store instructions, data, or any combination thereof. The controller 430 may also include one or more status registers 434, a state machine control circuit 436, sample codeword selection circuitry 437, a high voltage generator circuit 438, and an on-chip address decoder circuit 439. The sample codeword selection circuitry 437 may be configured to perform "in-memory" codeword selection operations at the storage component 408, which may reduce or avoid transfer of data between the controller component 404 and the storage component 408 in some circumstances.

The controller 430 may be coupled to provide electrical signals to the row decoder circuitry 450, to the column decoder circuitry 452, to the cache register 460, and to the data register and sense amplifier 462. In a particular embodiment, the controller 430, including one or more of the buffers 432, the status register 434, the state machine control circuit 436, the high-voltage generation circuit 438, and the on-chip address decoder circuit 439, in conjunction with the interface circuitry 420 and the memory array 440, may be configured to perform one or more operations described with reference to the method 200 of FIG. 2. Alternatively or in addition, the controller 412 may be configured to perform one or more operations of the method 200 of FIG. 2.

In a particular embodiment, the status register 434 of the controller 430 may include one or more indicators storing values, such as a pass/fail (P/F) value 441, a busy/ready (B/R) value 444, a write protect (WP) value 446, one or more other indicators, or a combination thereof. The status register 434 may be accessible to the state machine control circuit 436.

The state machine control circuit 436 may include dedicated hardware and circuitry to control an operation of the controller 430 in response to one or more received instructions and internal states, such as may be represented at the status register 434. The state machine control circuit 436 may include states such as a read status state, a data write state, a data read state, as illustrative, non-limiting examples.

In a particular embodiment, the high voltage generator circuit 438 may be responsive to the state machine control circuit 436 and may be configured to generate a high voltage to program values to, or erase values from, the memory array 440. For example, the memory array 440 may be a flash memory or other memory that may be programmable or erasable via a "high" voltage, such as, for example, five volts (V). Alternatively, the memory array 440 may include a ReRAM. The memory array 440 may have a 3D memory configuration, such as a vertical 3D memory configuration (e.g., a vertical 3D NAND flash memory configuration). The controller 430 may also include the on-chip address decoder circuit 439 that may include hardware and logic circuitry to receive memory address information from the controller component 404 and to decode the memory address information to specific rows and columns to be provided to the row decoder circuitry 450 and the column decoder circuitry 452.

The interface circuitry 420 may include data bus connectors 422, an output driver 424 coupled to the data bus connectors 422, and input/output (I/O) buffers and latches 426. The I/O buffers and latches 426 may be configured to store or to latch data that is received via the data bus connectors 422 or data that is to be written to the data bus 406 via the data bus connectors 422. The data bus connector 422 may include physical electrical connectors that couple the interface circuitry 420 to the data bus 406. The output driver 424 may include dedicated circuitry and electrical connections to enable the interface circuitry 420 to drive electrical signals over the data bus 406. In a particular embodiment, the interface circuitry 420 is configured to comply with one or more bus communications protocols or standards.

Figure 5:
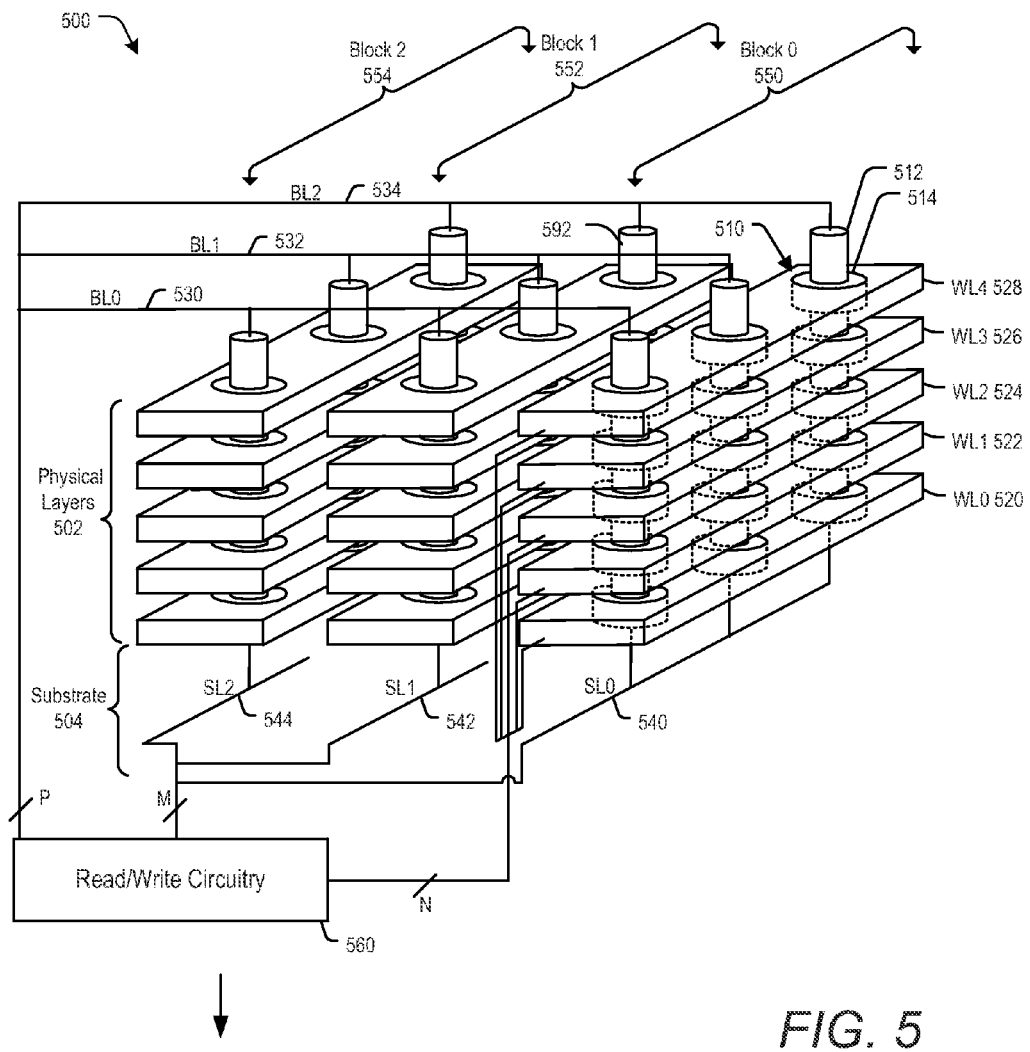
FIG. 5 is a block diagram of a particular embodiment of a memory that may be included in the data storage device of FIG. 1.

FIG. 5 illustrates an embodiment of a 3D memory 500 in a NAND flash configuration. The 3D memory 500 may correspond to the memory 104 of FIG. 1. The 3D memory 500 may be coupled to the controller 120 of FIG. 1.

The 3D memory 500 includes multiple physical layers, such as a group of physical layers 502. The multiple physical layers are monolithically formed above a substrate 504, such as a silicon substrate. Storage elements (e.g., memory cells), such as a representative memory cell 510, are arranged in arrays in the physical layers.

The representative memory cell 510 includes a charge trap structure 514 between a word line/control gate (WL4) 528 and a conductive channel 512. Charge may be injected into or drained from the charge trap structure 514 via biasing of the conductive channel 512 relative to the word line 528. For example, the charge trap structure 514 may include silicon nitride and may be separated from the word line 528 and the conductive channel 512 by a gate dielectric, such as silicon oxide. An amount of charge in the charge trap structure 514 affects an amount of current through the conductive channel 512 during a read operation of the memory cell 510 and indicates one or more bit values that are stored in the memory cell 510.

The 3D memory 500 includes multiple erase blocks, including a first block (block 0) 550, a second block (block 1) 552, and a third block (block 2) 554. Each block 550-554 includes a "vertical slice" of the physical layers 502 that includes a stack of word lines, illustrated as a first word line (WL0) 520, a second word line (WL1) 522, a third word line (WL2) 524, a fourth word line (WL3) 526, and a fifth word line (WL4) 528. Multiple conductive channels (having a substantially vertical orientation with respect to FIG. 5) extend through the stack of word lines. Each conductive channel is coupled to a storage element in each word line 520-528, forming a NAND string of storage elements. FIG. 5 illustrates three blocks 550-554, five word lines 520-528 in each block, and three conductive channels in each block for clarity of illustration. However, the 3D memory 500 may have more than three blocks, more than five word lines per block, and more than three conductive channels per block.

Read/write circuitry 560 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 504) and a first source line (SL0) 540, a second source line (SL1) 542, and a third source line (SL2) 544 at a "bottom" end of the conductive channels (e.g., nearer to or within the substrate 504). The read/write circuitry 560 is illustrated as coupled to the bit lines 530-534 via "P" control lines, coupled to the source lines 540-544 via "M" control lines, and coupled to the word lines 520-528 via "N" control lines. Each of P, M, and N may have a positive integer value based on the specific configuration of the 3D memory 500. In the illustrative example of FIG. 5, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

The read/write circuitry 560 may operate as described with respect to the read/write circuitry 106 of FIG. 1. For example, data may be stored to storage elements coupled to the word line 528 and the read/write circuitry 560 may read bit values from the storage elements. As another example, the read/write circuitry 560 may apply selection signals to control lines coupled to the word lines 520-528, the bit lines 530-534, and the source lines 540-542 to cause a programming voltage (e.g., a voltage pulse or series of voltage pulses) to be applied across selected storage element(s) of the selected word line (e.g., the fourth word line 528).

During a read operation, the controller 120 may receive a request from a host device, such as the host device 174 of FIG. 1. The controller 120 may cause the read/write circuitry 560 to read bits from particular storage elements of the 3D memory 500 by applying appropriate signals to the control lines to cause storage elements of a selected word line to be sensed. Accordingly, the 3D memory 500 may be configured to read from and write data to one or more storage elements.

Figure 6:
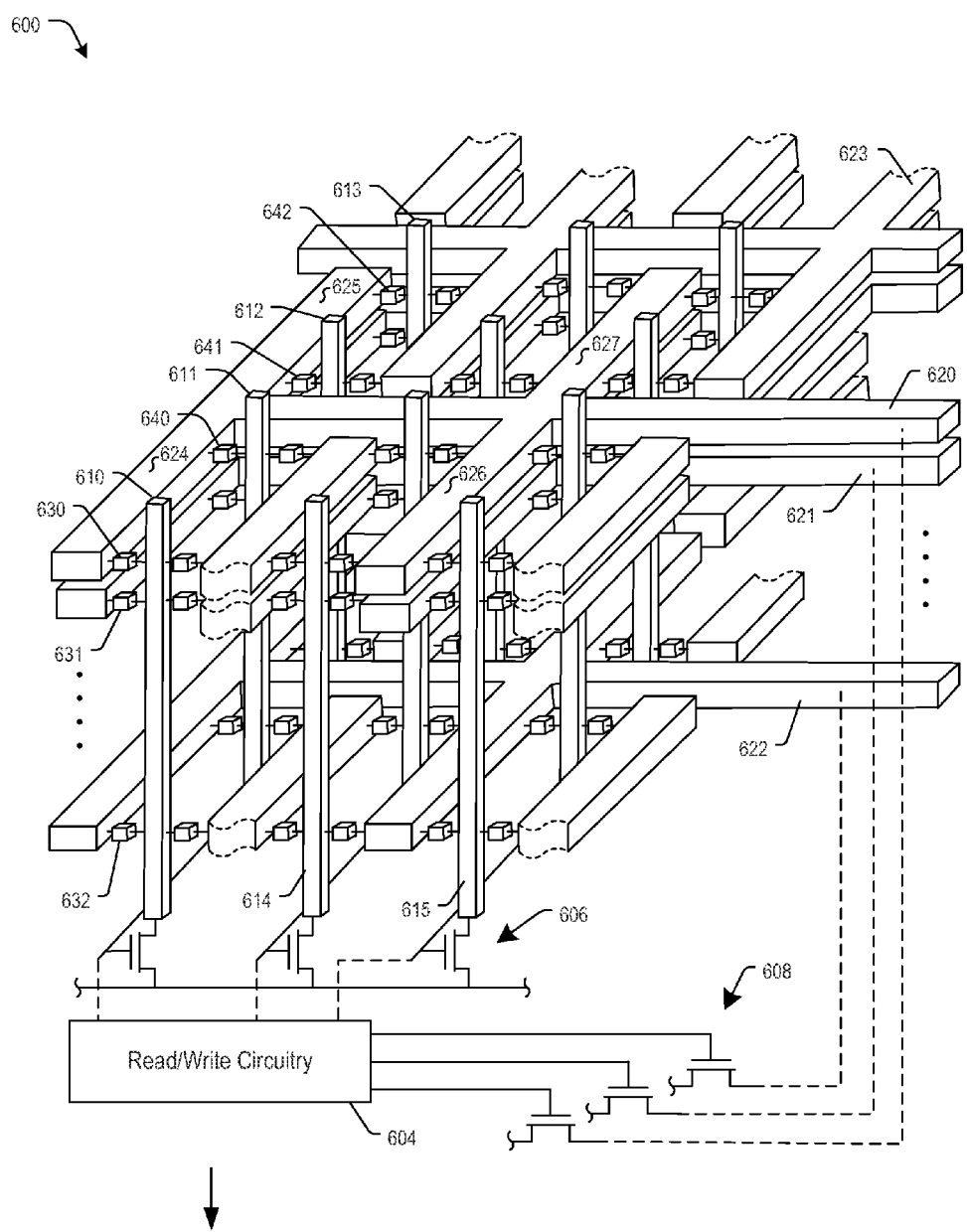
FIG. 6 is a block diagram of another particular embodiment of a memory that may be included in the data storage device of FIG. 1.

FIG. 6 is a diagram of a particular embodiment of a memory 600. The memory 600 may be included in the data storage device 102 of FIG. 1. For example, the memory 600 may correspond to the memory 104 of FIG. 1. The memory 600 may be coupled to the controller 120 of FIG. 1.

In the embodiment illustrated in FIG. 6, the memory is a vertical bit line ReRAM with a plurality of conductive lines in physical layers over a substrate (e.g., substantially parallel to a surface of the substrate), such as representative word lines 620, 621, 622, and 623 (only a portion of which is shown in FIG. 6) and a plurality of vertical conductive lines through the physical layers, such as representative bit lines 610, 611, 612, and 613. The word line 622 may include or correspond to a first group of physical layers, and the word lines 620, 621 may include or correspond to a second group of physical layers.

The memory 600 also includes a plurality of resistance-based storage elements (e.g., memory cells), such as representative storage elements 630, 631, 632, 640, 641, and 642, each of which is coupled to a bit line and a word line in arrays of memory cells in multiple physical layers over the substrate (e.g., a silicon substrate). The memory 600 also includes read/write circuitry 604, such as the read/write circuitry 106 of FIG. 1. The read/write circuitry 604 is coupled to word line drivers 608 and bit line drivers 606.

In the embodiment illustrated in FIG. 6, each of the word lines includes a plurality of fingers (e.g., a first word line 620 includes fingers 624, 625, 626, and 627). Each finger may be coupled to more than one bit line. To illustrate, a first finger 624 of the first word line 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one word line. To illustrate, the first bit line 610 is coupled to the first word line 620 via the first storage element 630 and is coupled to a third word line 622 via a third storage element 632.

During a write operation, the controller 120 of FIG. 1 may receive data from a host device, such as the host device 174 of FIG. 1. The controller 120 may send the data (or a representation of the data) to the memory 600. For example, the controller 120 may encode the data prior to sending the encoded data to the memory 600.

The read/write circuitry 604 may write the data to storage elements corresponding to the destination of the data. For example, the read/write circuitry 604 may apply selection signals to selection control lines coupled to the word line drivers 608 and the bit line drivers 606 to cause a write voltage to be applied across a selected storage element. For example, to select the first storage element 630, the read/write circuitry 604 may activate the word line drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to word lines other than the first word line 620 and applying a second voltage to the first word line 620. In a particular embodiment, the first voltage is applied to other bit lines (e.g., the bit lines 614, 615) to reduce leakage current in the memory 600.

During a read operation, the controller 120 may receive a request from a host device, such as the host device 174 of FIG. 1. The controller 120 may cause the read/write circuitry 604 to read bits from particular storage elements of the memory 600 by applying selection signals to selection control lines coupled to the word line drivers 608 and the bit line drivers 606 to cause a read voltage to be applied across a selected storage element. For example, to select the first storage element 630, the read/write circuitry 604 may activate the word line drivers 608 and the bit line drivers 606 to apply a first voltage (e.g., 0.7 volts (V)) to the first bit line 610 and to word lines other than the first word line 620. A lower voltage (e.g., 0 V) may be applied to the first word line 620. Thus, a read voltage is applied across the first storage element 630, and a read current corresponding to the read voltage may be detected at a sense amplifier of the read/write circuitry 604. The read current corresponds (via Ohm's law) to a resistance state of the first storage element 630, which corresponds to a logical value stored at the first storage element 630. The logical value read from the first storage element 630 and other elements read during the read operation may be provided to the controller 120.

Although the controller 120 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. As an illustrative example, the codeword indication selector 150 may include circuitry (e.g., logic gates and/or comparators) configured to select between logical addresses indicated by the logical-to-physical address mapping table 138.

Alternatively or in addition, one or more aspects of the data storage device 102 may be implemented using a microprocessor or microcontroller programmed (e.g., by executing instructions) to perform operations described herein, such as one or more operations of the method 200 of FIG. 2. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). One or more operations described herein as being performed by the controller 120 may be performed at the memory 104 (e.g., "in-memory" ECC operations, as an illustrative example) alternatively or in addition to performing such operations at the controller 120.

To further illustrate, the controller 120 may include a processor that is configured to execute instructions to perform certain operations described herein. The instructions may include general purpose instructions, and the processor may include a general purpose execution unit operable to execute general purpose instructions. The processor may access the instructions from the memory 104, from the RAM 130, from a ROM of the controller 120 (not shown), from another memory location, or a combination thereof. The processor may execute the instructions to perform one or more operations described herein. As an illustrative example, the processor may execute the instructions to perform a compare operation (e.g., by executing a compare instruction) to determine a physical address of the physical addresses Px, Py, and Pz having a numerically lowest value.

The data storage device 102 may be attached to or embedded within one or more host devices, such as within a housing of a host communication device (e.g., the host device 174). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 180.

To further illustrate, the data storage device 102 may be configured to be coupled to the host device 174 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact-Flash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory; and
a controller operationally coupled to the non-volatile memory, wherein the controller is configured to program information to the non-volatile memory, the information including multiple codewords, wherein the controller is further configured to access a sample codeword of the multiple codewords from the non-volatile memory and to determine an error rate associated with the sample codeword, the error rate determined by an error correcting code (ECC) engine, and wherein the controller is further configured to re-program the information at the non-volatile memory in response to the error rate satisfying an error threshold.

2. The data storage device of claim 1, wherein the non-volatile memory includes a resistive random access memory (ReRAM).

3. The data storage device of claim 1, wherein the controller includes a codeword indication selector configured to select an indication of the sample codeword from a set of indications associated with the multiple codewords.

4. The data storage device of claim 3, wherein the controller is further configured to program the multiple codewords in a sequence, wherein the codeword indication selector is further configured to select the indication based on the sequence, and wherein the indication corresponds to a first item of the sequence.

5. The data storage device of claim 4, wherein the controller is further configured to store a logical-to-physical address mapping table, and wherein the codeword indication selector is further configured to access the logical-to-physical address mapping table to determine the sequence.

6. The data storage device of claim 1, wherein the controller includes the ECC engine.

7. The data storage device of claim 1, wherein the non-volatile memory has a three-dimensional (3D) memory configuration that is monolithically formed in one or more physical levels of arrays of memory cells having an active area above a silicon substrate, and further comprising circuitry associated with operation of the memory cells.

8. A method comprising:
at a data storage device that includes a non-volatile memory and a controller, performing by the controller:
programming information to the non-volatile memory, the information including multiple codewords;
accessing a sample codeword of the multiple codewords from the non-volatile memory;
determining an error rate associated with the sample codeword, the error rate determined by an error correcting code (ECC) engine; and
in response to the error rate satisfying an error threshold, re-programming the information at the non-volatile memory.

9. The method of claim 8, wherein non-volatile memory includes a resistive random access memory (ReRAM).

10. The method of claim 8, further comprising selecting an indication of the sample codeword from a set of indications associated with the multiple codewords, wherein the sample codeword is accessed from the non-volatile memory in response to selecting the indication.

11. The method of claim 10, further comprising accessing a logical-to-physical address mapping table to select the indication from a set of physical addresses indicated by the logical-to-physical address mapping table, the logical-to-physical address mapping table accessed by a codeword indication selector of the controller, wherein the set of physical addresses corresponds to the set of indications.

12. The method of claim 11, wherein the multiple codewords are programmed in a sequence by read/write circuitry of the non-volatile memory, and wherein the indication corresponds to a first item of the sequence.

13. The method of claim 8, wherein the error rate corresponds to a bit error rate (BER) of the sample codeword.

14. The method of claim 8, further comprising comparing the error rate to the error threshold to determine whether the error rate satisfies the threshold.

15. The method of claim 8, further comprising encoding data to generate the information prior to programming the information to the non-volatile memory.

16. The method of claim 15, further comprising re-encoding the data to generate second information in response to the error rate satisfying the error threshold, the second information including a second set of codewords corresponding to the multiple codewords, wherein re-programming the information includes overwriting the information with the second information.

17. The method of claim 8, wherein programming the information includes writing the information to a cache of the non-volatile memory and to a storage region of the non-volatile memory, and further comprising accessing the cache to retrieve a representation of the information in response to the error rate satisfying the error threshold, wherein re-programming the information includes overwriting the information with the representation of the information retrieved from the cache.

18. The method of claim 8, wherein the information is programmed and re-programmed to a storage region at a same physical location of the non-volatile memory.

19. The method of claim 8, wherein the controller includes the ECC engine.

20. The method of claim 8, wherein the non-volatile memory has a three-dimensional (3D) memory configuration that is monolithically formed in one or more physical levels of arrays of memory cells having an active area above a silicon substrate, and wherein the non-volatile memory includes circuitry associated with operation of the memory cells.

* * * * *